United States Patent
Feilen

(10) Patent No.: US 11,789,079 B2
(45) Date of Patent: Oct. 17, 2023

(54) MEASUREMENT SYSTEM AND MEASUREMENT METHOD

(71) Applicant: Rohde & Schwarz GmbH & Co. KG, Munich (DE)

(72) Inventor: Michael Feilen, Munich (DE)

(73) Assignee: Rohde & Schwarz GmbH & Co. KG, Munich (DE)

(*) Notice: Subject to any disclaimer, the term of this patent is extended or adjusted under 35 U.S.C. 154(b) by 267 days.

(21) Appl. No.: 17/211,030

(22) Filed: Mar. 24, 2021

(65) Prior Publication Data

US 2022/0308111 A1   Sep. 29, 2022

(51) Int. Cl.
*G01R 31/00* (2006.01)
*G01R 31/319* (2006.01)
*G01R 31/3193* (2006.01)

(52) U.S. Cl.
CPC .  *G01R 31/31926* (2013.01); *G01R 31/31935* (2013.01)

(58) Field of Classification Search
CPC ........ G01R 31/31926; G01R 31/31932; G01R 31/31935; G01R 31/31905; G01R 31/31907; G01R 31/3193; G01R 31/31924
See application file for complete search history.

(56) References Cited

U.S. PATENT DOCUMENTS

| | | | | |
|---|---|---|---|---|
| 7,162,073 | B1* | 1/2007 | Akgul | G06T 7/0004 356/73.1 |
| 11,165,799 | B2* | 11/2021 | Gapper | G06F 17/18 |
| 2005/0048379 | A1* | 3/2005 | Koehle | G03F 1/84 430/30 |
| 2009/0196490 | A1* | 8/2009 | Matsumiya | G06F 18/00 382/149 |
| 2020/0005446 | A1* | 1/2020 | Tsou | G06T 7/001 |
| 2021/0174485 | A1* | 6/2021 | Nuthi | G06T 7/0002 |
| 2021/0239736 | A1* | 8/2021 | Tsai | G01R 31/31935 |
| 2022/0067902 | A1* | 3/2022 | Dou | G06F 18/24 |
| 2022/0122243 | A1* | 4/2022 | Fitzgerald | G06N 3/084 |

FOREIGN PATENT DOCUMENTS

EP            3518441 A1   7/2019

* cited by examiner

*Primary Examiner* — Thang X Le
(74) *Attorney, Agent, or Firm* — CHRISTENSEN O'CONNOR JOHNSON KINDNESS PLLC

(57) ABSTRACT

A measurement system is described. The measurement system includes a test-and-measurement (T&A) circuit and an error analysis circuit. The T&A circuit is configured to generate measurement data. The measurement data includes at least one of analysis data and configuration data. The analysis data is associated with an analysis of at least one input signal. The configuration data is associated with at least one of a physical measurement setup of the measurement system and measurement settings of the measurement system. The T&A circuit further is configured to generate a graphic representation of the measurement data. The error analysis circuit is configured to identify errors or anomalies associated with the measurement data based on the graphic representation. Further, a measurement method is described.

16 Claims, 3 Drawing Sheets

MEASUREMENT SYSTEM AND MEASUREMENT METHOD

FIELD OF THE DISCLOSURE

Embodiments of the present disclosure generally relate to a measurement system. Embodiments of the present disclosure further relate to a measurement method.

BACKGROUND

During measurements of an input signal, errors may occur due to different reasons. For example, disturbances may be present in the measured signal, such as a strong background noise or aggressor signals that affect the signal to be measured. Finding the actual reasons for such disturbances can be a time-consuming task that requires a lot of expert knowledge from a user, as there are different possible error sources. For example, the measurement setup itself may be incorrect. As another example, the signal to be measured may be influenced by other electronic devices or components.

Thus, there is a need for a measurement system and a measurement method that allow for an easier identification of errors associated with measurements of an input signal.

SUMMARY

Embodiments of the present disclosure provide a measurement system. In an embodiment, the measurement system comprises a test-and-measurement module, also called test-and-analysis module (abbreviated by T&A module in the following) having one or more circuits, and an error analysis module having one or more circuits. The T&A module is configured to generate measurement data. The measurement data comprises at least one of analysis data and configuration data. The analysis data is associated with an analysis of at least one input signal. The configuration data is associated with at least one of a physical measurement setup of the measurement system and measurement settings of the measurement system. The T&A module further is configured to generate a graphic representation of the measurement data. The error analysis module is configured to identify errors or anomalies associated with the measurement data based on the graphic representation.

Therein and in the following, the term "analysis data" is understood to comprise all kinds of data that is obtained during a measurement of the at least one input signal. For example, the analysis data may comprise samples associated with the input signal, samples associated with the at least one input signal that have been processed by one or several components of the measurement system (such as filters, down-converters, up-converters, etc.) and/or any quantities calculated based on the at least one input signal.

Moreover, the term "identify errors or anomalies" is understood to comprise any one of the following meanings: determining a cause of the error and/or anomaly, determining a portion of the at least one input signal bearing the error and/or anomaly, determining a device causing the error and/or anomaly and/or classifying the error and/or anomaly.

The configuration data may comprise information on an actual physical setup of the measurement system. For example, the configuration data may comprise information on a device under test, devices used for the measurements, physical connections between these devices, missing connections, etc.

Alternatively or additionally, the configuration data may comprise information on the internal settings of the measurement system, for example internal settings of a device under test, of the T&A module and/or of the error analysis module.

The measurement system according to some embodiments of the present disclosure automatically identifies the errors and/or anomalies associated with the measurement data based on the graphic representation of the measurement data.

In some embodiments, the error analysis module identifies the errors and/or anomalies solely based on the graphic representation, i.e. without taking into account the measurement data itself.

In other words, the error analysis module in some embodiments identifies the errors and/or anomalies based on the graphic representation, but not based on the measurement data that is used for generating the graphic representation.

The error analysis module may use image recognition techniques, image processing techniques, and/or image classification techniques in order to identify the errors and/or anomalies associated with the measurement data based on the graphic representation.

Accordingly, a user of the measurement system does not need to have all the expert knowledge required in order to manually identify the errors and/or anomalies associated with the measurement data, as the measurement system automatically identifies these without an intervention of the user being necessary.

For example, the measurement system or rather the error analysis module may automatically identify that a device under test is not properly connected to the T&A module. As another example, the error analysis module may automatically identify that considerable noise is generated by a probe head used to pick of the at least one input signal. As another example, the error analysis module may automatically identify that there is a non-linear distortion in a QPSK signal analyzed by the T&A module.

It has turned out that the errors and/or anomalies can be identified on-the-fly, i.e., during active measurements of the at least one input signal. In other words, the measurement system according the present disclosure is capable of identifying the errors and/or anomalies in real time.

The measurement system may comprise a measurement device, wherein the measurement device may comprise the T&A module and/or the error analysis module. In some embodiments, the measurement instrument may comprise both the T&A module and the error analysis module.

The measurement device may be established as an oscilloscope, as a signal analyzer, as a (vector) network analyzer or as any other type of test and/or measurement instrument.

According to an aspect of the present disclosure, the error analysis module comprises a machine-learning module having one or more circuits. The machine-learning module can be trained to identify the errors or the anomalies associated with the measurement data based on the graphic representation.

The machine-learning module may be pre-trained by a manufacturer of the measurement system or of components thereof. For example, an expert may perform several measurements and mark the errors and anomalies in the graphic representation of the measurement data. In some embodiments, the expert may further identify a cause of the respective error or anomaly. This way, labelled training data is obtained, e.g. data pairs, that can be used for training the machine-learning module. The data pairs of the labelled training data may comprise input data as well as output data related to the input data such that the machine-learning module gets trained.

Alternatively or additionally, the machine-learning module may be trained by a user of the measurement system. For example, an expert user may train the machine-learning module as described above, for example by using labelled training data. After the training, the measurement system can also be used by non-expert users, as the measurement system is capable of identifying the errors and/or anomalies automatically after the training by the expert user.

Alternatively or additionally, settings for the machine-learning module may be downloaded from a database. The database may comprise respective settings for different types of measurements that can be loaded into the measurement system, for example into the error analysis module.

The database may be updated by the manufacturer or by users of the measurement system. For example, additional training data may be provided by the manufacturer and/or the users when a new type of error or anomaly is found.

According to another aspect of the present disclosure, the machine-learning module comprises an artificial neural network, wherein the artificial neural network is trained to identify the errors or the anomalies associated with the measurement data based on the graphic representation. Artificial neural networks are particularly suitable for processing, recognizing and/or classifying graphic representations, for example images. The artificial neural network may be trained as described above in the context of the machine-learning module, e.g. by labelled training data, for example the data pairs.

In an embodiment of the present disclosure, the graphic representation comprises an image or a set of images. Thus, the error analysis module is configured to identify the errors and/or anomalies based on the image or based on the images representing the measurement data, but not based on the measurement data itself. Accordingly, the error analysis module may employ image recognition techniques, image processing techniques, and/or image classification techniques in order to identify the errors and/or anomalies associated with the measurement data.

According to a further embodiment of the present disclosure, the error analysis module is configured to generate a graphic representation of the identified errors or anomalies. Thus, the identified errors and/or anomalies are not simply written into a log-file, which may be difficult to read and understand for a user of the measurement system. Instead, a graphic representation of the identified errors and/or anomalies is generated, which may be much easier to understand for the user, for example in an intuitive manner.

According to a further aspect of the present disclosure, the measurement system comprises a display, wherein the display is configured to display both the graphic representation of the measurement data and the graphic representation of the identified errors or anomalies simultaneously. In other words, the measurement data and the corresponding identified errors and anomalies are displayed simultaneously on the display. This way, information relating to both the measurement data and the errors and anomalies associated with the measurement data is displayed on the display in a for example lucid way.

The display may be configured to display the graphic representation of the measurement data and the graphic representation of the identified errors or anomalies in a superposed manner. This way, portions of the measurement data bearing an error or anomaly are readily identifiable for a user of the measurement system, as the graphic representation of the identified errors or anomalies is located directly on top of the respective portion of the graphic representation of the measurement data comprising the error or anomaly.

In an embodiment of the present disclosure, the graphic representation of the identified errors or anomalies comprises a mask marking an area comprising the errors or anomalies. The mask may comprise a margin enclosing a region of the graphic representation of the measurement data comprising the error or anomaly. Alternatively or additionally, the mask may comprise a coloring, a shading or another suitable type of highlighting for marking the area comprising the errors or anomalies.

The mask may comprise information on thresholds associated with the errors or anomalies. In some embodiments, the mask may comprise visual signs marking the threshold and/or text information regarding the respective threshold.

Therein and the following, the term "threshold" is understood to denote a maximum deviation of the graphic representation of the measurement data from an expected, acceptable value range that corresponds to a correctly functioning measurement system without relevant errors and/or anomalies.

Accordingly, the error analysis module may analyze whether the graphic representation crosses any threshold in order to identify the errors and/or anomalies.

In a further embodiment of the present disclosure, the error analysis module is configured to generate error data, the error data comprising additional information on the identified errors or anomalies. In some embodiments, the error data may comprise information on a most likely source of the errors and/or anomalies, on a class of the errors and/or anomalies, on a specific type of the errors and/or anomalies, on possible ways to fix the errors and/or anomalies, etc. The error data may be displayed on the display, e.g. as a message and/or as an image representing the error data.

According to an aspect of the present disclosure, the error analysis module is configured to identify the errors or anomalies in real-time. Thus, the error analysis module may run in the background during measurements performed by the T&A module. The error analysis module may identify and display errors and/or anomalies on-the-fly, i.e., during the active measurements performed by the T&A module.

According to another aspect of the present disclosure, the error analysis module is configured to generate a user warning if an error or an anomaly is identified. The user warning may comprise a visual signal, an acoustic signal and/or a haptic signal.

For example, the user warning may comprise a flashing light on the display and/or a warning sound that is played by a loudspeaker of the measurement system.

In an embodiment of the present disclosure, the T&A module and the error analysis module are both integrated into a common measurement device. In other words, the T&A module and the error analysis module are commonly housed in a housing. Thus, a highly integrated measurement system is provided.

In another embodiment of the present disclosure, the measurement system further comprises a computer module, wherein the computer module is arranged external to the T&A module, and wherein the computer module comprises the error analysis module. The computer module may be established as a local computer, laptop, smartphone, tablet, or as any other kind of smart device having a processing circuit. Alternatively or additionally, the computer module may be established as a remote server that is connected to the T&A module via a network, for example via the internet.

Embodiments of the present disclosure further provide a measurement method. In an embodiment, the measurement method comprises the following steps:
- generating measurement data by a test-and-measurement (T&A) module, the measurement data comprising at least one of analysis data and configuration data, the analysis data being associated with an analysis of at least one input signal, and the configuration data being associated with at least one of a physical measurement setup of a measurement system and measurement settings of the measurement system;
- generating a graphic representation of the measurement data by the T&A module; and
- identifying errors or anomalies associated with the measurement data by an error analysis module based on the graphic representation.

In some embodiments, examples of the measurement system described above are configured to perform the measurement method.

Regarding the advantages and further properties of the measurement method, reference is made to the explanations given above with respect to the measurement system, which also hold for the measurement method and vice versa.

According to an aspect of the present disclosure, the error analysis module comprises a machine-learning module, wherein the machine-learning module is trained to identify the errors or the anomalies associated with the measurement data based on the graphic representation.

The machine-learning module may be pre-trained by a manufacturer of the measurement system or of components thereof. For example, an expert may perform several measurements and mark the errors and anomalies in the graphic representation of the measurement data. In some embodiments, the expert may further identify a cause of the respective error or anomaly. This way, labelled training data is obtained that can be used for training the machine-learning module.

Alternatively or additionally, the machine-learning module may be trained by a user of the measurement system. For example, an expert user may train the machine-learning module as described above. After the training, the measurement system can also be used by non-expert users, as the measurement system is capable of identifying the errors and/or anomalies automatically after the training by the expert user.

Alternatively or additionally, settings for the machine-learning module may be downloaded from a database. The database may comprise respective settings for different types of measurements that can be loaded into the measurement system, for example into the error analysis module.

The database may be updated by the manufacturer or by users of the measurement system. For example, additional training data may be provided by the manufacturer and/or the users when a new type of error or anomaly is found.

According to a further aspect of the present disclosure, the machine-learning module comprises an artificial neural network, wherein the artificial neural network is trained to identify the errors or the anomalies associated with the measurement data based on the graphic representation. Artificial neural networks are particularly suitable for processing, recognizing and/or classifying graphic representations, for example images. The artificial neural network may be trained as described above in the context of the machine-learning module.

In an embodiment of the present disclosure, a graphic representation of the identified errors or anomalies is generated by the error analysis module. Thus, the identified errors and/or anomalies are not simply written into a log-file, which may be difficult to read and understand for a user of the measurement system. Instead, a graphic representation of the identified errors and/or anomalies is generated, which may be much easier to understand for the user.

According to a further aspect of the present disclosure, both the graphic representation of the measurement data and the graphic representation of the identified errors or anomalies are displayed on a display simultaneously. In other words, the measurement data and the corresponding identified errors and anomalies are displayed simultaneously on the display. This way, information relating to both the measurement data and the errors and anomalies associated with the measurement data is displayed on the display in a for example lucid way.

The graphic representation of the measurement data and the graphic representation of the identified errors or anomalies may be displayed in a superposed manner. This way, portions of the measurement data bearing an error or anomaly are readily identifiable for a user of the measurement system, as the graphic representation of the identified errors or anomalies is located directly on top of the respective portion of the graphic representation of the measurement data comprising the error or anomaly.

According to another aspect of the present disclosure, the graphic representation of the identified errors or anomalies comprises a mask marking an area comprising the errors or anomalies. The mask may comprise a margin enclosing a region of the graphic representation of the measurement data comprising the error or anomaly. Alternatively or additionally, the mask may comprise a coloring, a shading or another suitable type of highlighting for marking the area comprising the errors or anomalies.

The mask may comprise information on thresholds associated with the errors or anomalies. In some embodiments, the mask may comprise visual signs marking the threshold and/or text information regarding the respective threshold.

Accordingly, the error analysis module may analyze whether the graphic representation crosses any threshold in order to identify the errors and/or anomalies.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

In some embodiments described herein, the term "module" refers to or includes, inter alia, a combination of hardware (e.g. a processor such as an integrated circuit or other circuitry) and software (e.g. machine- or processor-executable instructions, commands, or code such as firmware, programming, or object code). Furthermore, a combination of hardware and software may include hardware only (i.e. a hardware element with no software elements), software hosted at hardware (e.g. software that is stored at a memory and executed or interpreted at a processor), or hardware with the software hosted thereon. In some embodiments, the hardware may, inter alia, comprise a CPU, a GPU, an FPGA, an ASIC, or other types of electronic circuitry.

Figure 1:
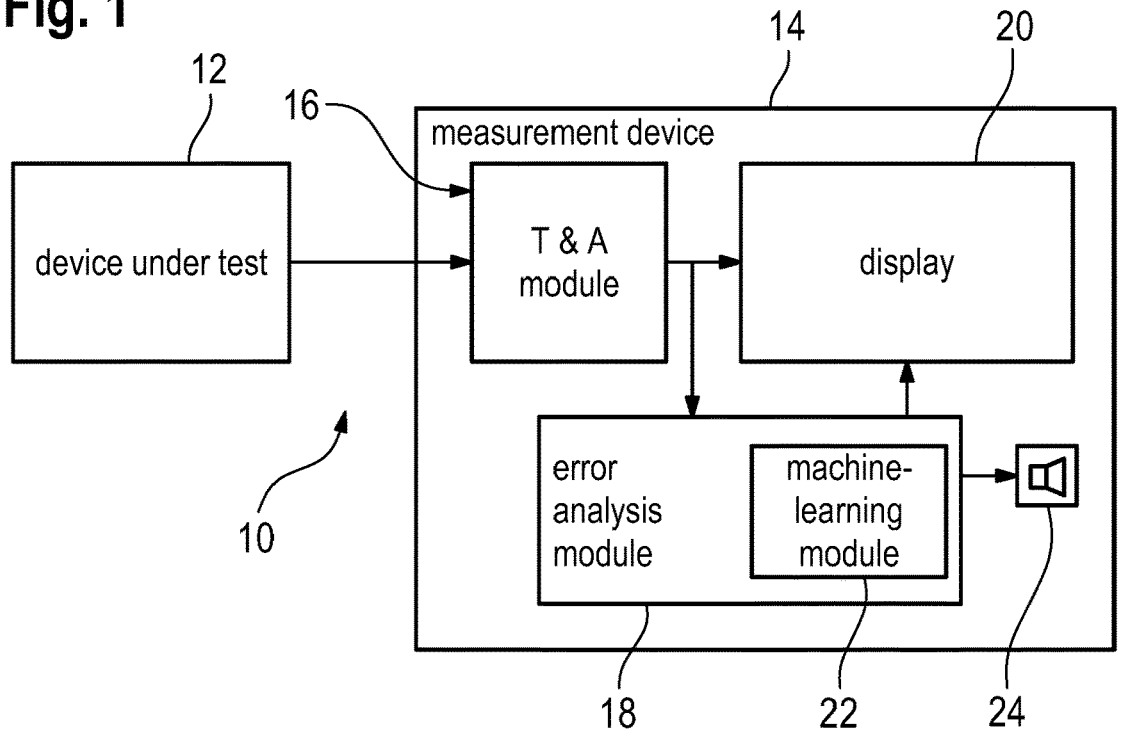
FIG. 1 schematically shows a measurement system according to a first embodiment of the present disclosure.

FIG. 1 schematically shows a measurement system 10 comprising a device under test 12 and a measurement device 14. The measurement device 14 may be established as an oscilloscope, as a signal analyzer, as a (vector) network analyzer, etc., as any other type of test and/or measurement instrument.

The device under test 12 may be established as an arbitrary electronic device having, for example, one or more circuits, electrical components, etc., that is to be tested via the measurement device 14. The device under test 12 is connected to the measurement device 14 in a signal transmitting manner, such that the measurement device 14 can receive and analyze an input signal generated by the device under test 12. Therein and in the following, the term "connected in a signal transmitting manner" is understood to denote a cable-based or wireless connection that is configured to transmit signals between the respective devices or components.

The measurement device 14 comprises a test-and-measurement (T&A) circuit or module 16, an error analysis circuit or module 18, and a display 20, which are commonly housed in a single housing as illustrated in FIG. 1.

The error analysis module 18 comprises a machine-learning circuit or module 22, wherein the machine learning module 22 may comprise an artificial neural network. In other words, the machine-learning module 22 may be established by an artificial neural network.

The functionality of the measurement system 10 will be described in more detail below. Optionally, the measurement device 14 may comprise a loudspeaker 24 as shown in FIG. 1.

Figure 2:
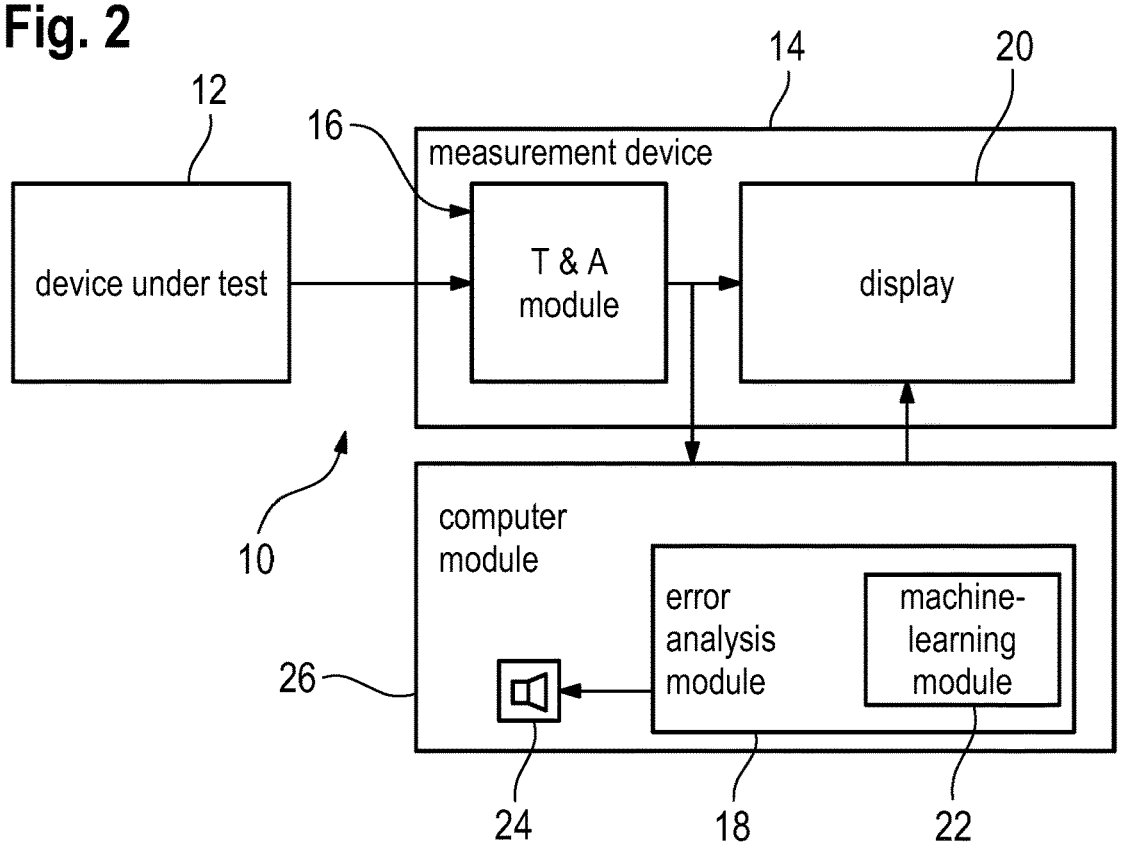
FIG. 2 schematically shows a measurement system according to a second embodiment of the present disclosure.

FIG. 2 schematically shows a second embodiment of the measurement system 10, wherein only the differences compared to the first variant will be described in the following. In this embodiment, the measurement system 10 comprises a computer circuit or module 26 that is established separately from the measurement device 14. In other words, the computer module 26 has its own housing, whereas the measurement device 14 also has its own housing. In the embodiment shown, the computer module 26 comprises the error analysis module 18.

In some embodiments, the computer module 26 may be established as a local computer, laptop, smartphone, tablet, or as any other kind of smart device having a processing circuit. Alternatively or additionally, the computer module 26 may be established as a remote server that is connected to the measurement device 14 via a network, for example via the internet.

Optionally, the computer module 26 may comprise the loudspeaker 24. However, it is to be understood that the measurement device 14 may comprise the loudspeaker 24, even if this is not shown in FIG. 2. For instance, both the computer module 26 and the measurement device 14 may each comprise a loudspeaker or omit the loudspeaker.

Figure 3:
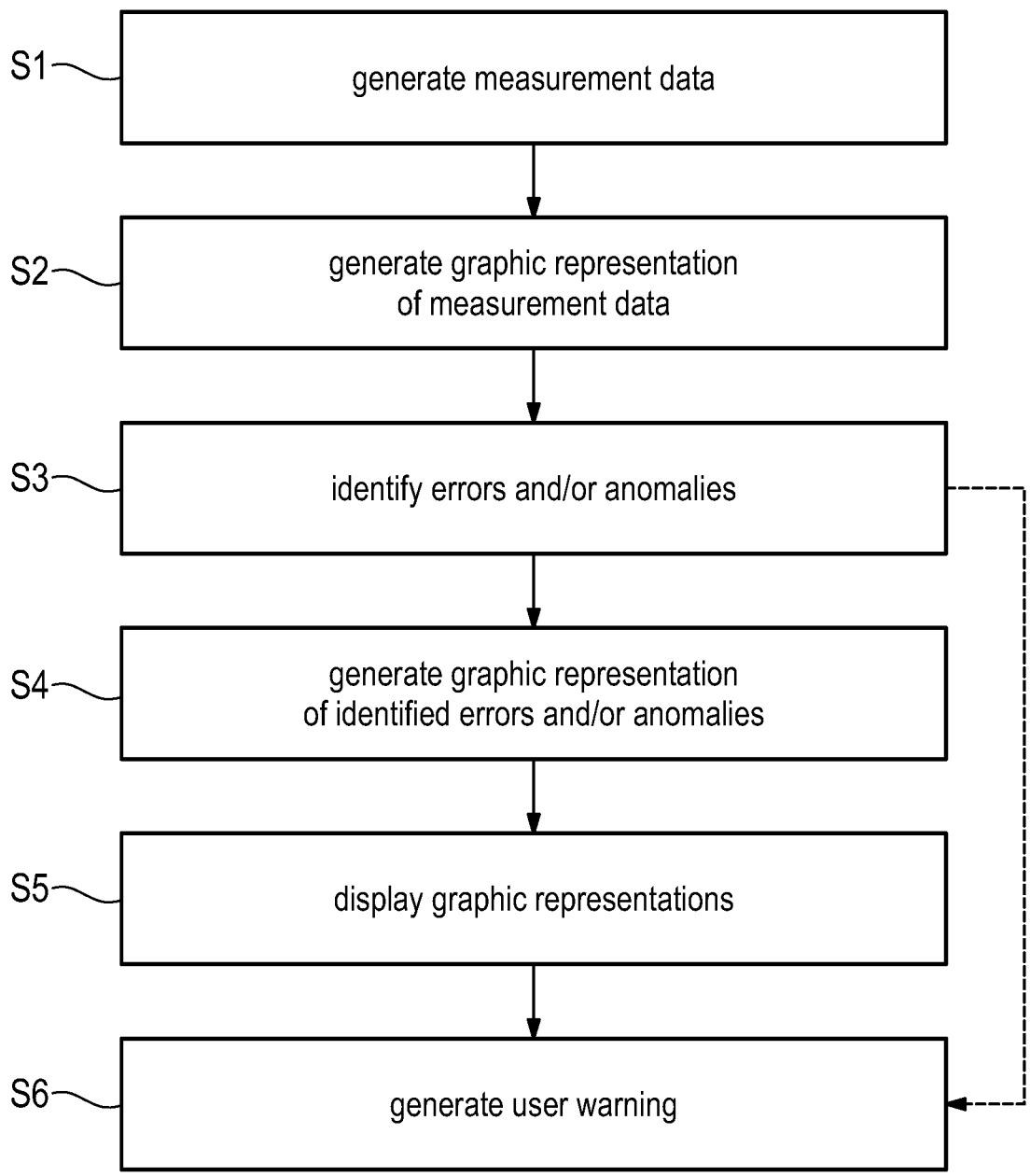
FIG. 3 shows a flowchart of a measurement method according to an embodiment of the present disclosure.

The measurement system 10 is configured to perform a measurement method, an example of which is described in the following with reference to FIG. 3.

Measurement data is generated by the T&A module 16, wherein the measurement data comprises analysis data and/or configuration data (step S1). The analysis data is associated with an analysis of at least one input signal received from the device under test 12. In other words, the analysis data comprises all kinds of data that is obtained by the T&A module 16 during a measurement of the at least one input signal generated by the device under test 12.

For example, the analysis data may comprise samples associated with the at least one input signal, samples associated with the at least one input signal that have been processed by one or several components of the T&A module 16 (such as filters, down-converters, up-converters, etc.) and/or any quantities calculated by the T&A module 16 based on the at least one input signal.

The configuration data comprises information on an actual physical setup of the measurement system 10. For example, the configuration data may comprise information on the device under test 12, the type of the measurement device 14, physical connections between the device under test 12 and the measurement device 14 (e.g. whether the connection is correctly established), missing connections, etc.

Alternatively or additionally, the configuration data may comprise information on the internal settings of the measurement system 10, for example internal settings of the device under test 12, of the T&A module 16 and/or of the error analysis module 18.

A graphic representation of the measurement data is generated by the T&A module 16 (step S2). In general, the graphic representation is generated in a format that is suitable for displaying on the display 20.

In some embodiments, the graphic representation of the measurement data comprises an image or a set of images that can be displayed on the display 20. For example, the graphic representation may comprise a diagram of a quantity measured during the analysis of the at least one input signal plotted against time, against frequency, or against another quantity. The graphic representation is forwarded to the display 20 and to the error analysis module 18.

Errors and/or anomalies associated with the measurement data are identified by the error analysis module 18 based on the graphic representation of the measurement data (step S3). The machine-learning module 22 of the error analysis module 18 is trained to identify the errors and/or anomalies based on the graphic representation of the measurement data.

Therein, the term "identify errors or anomalies" is understood to comprise any one of the following meanings: determining a cause of the error and/or anomaly, determining a portion of the at least one input signal bearing the error and/or anomaly, determining a device causing the error and/or anomaly and/or classifying the error and/or anomaly.

The error analysis module 18 or rather the machine-learning module 22 identifies the errors and/or anomalies based on the graphic representation of the measurement data, but not based on the measurement data itself.

The machine-learning module 22 may use image recognition techniques, image processing techniques, and/or image classification techniques in order to identify the errors and/or anomalies associated with the measurement data based on the graphic representation of the measurement data.

Optionally, the error analysis module 18 may generate error data, wherein the error data comprises additional information on the identified errors or anomalies.

The error data may comprise information on a most likely source of the errors and/or anomalies, on a class of the errors and/or anomalies, on a specific type of the errors and/or anomalies, and/or on possible ways to fix the errors and/or anomalies.

A graphic representation of the identified errors and/or anomalies is generated by the error analysis module 18 (step S4). The graphic representation of the identified errors and/or anomalies may comprise an image or a set of images that can be displayed on the display 20.

For example, the graphic representation of the identified errors and/or anomalies may comprise a diagram of the identified errors and/or anomalies plotted against time, against frequency, or against another quantity.

The graphic representation of the identified errors and/or anomalies may comprise a mask marking an area comprising the errors or anomalies. For example, the mask may comprise a margin enclosing a region of the graphic representation of the measurement data comprising the error or anomaly. Alternatively or additionally, the mask may comprise a coloring, a shading or another suitable type of highlighting for marking the area comprising the errors or anomalies.

The mask may comprise information on thresholds associated with the errors or anomalies. In some embodiments, the mask may comprise visual signs marking the threshold and/or text information regarding the respective threshold.

Therein and the following, the term "threshold" is understood to denote a maximum deviation of the graphic representation of the measurement data from an expected, acceptable value range that corresponds to a correctly functioning measurement system 10 without relevant errors and/or anomalies.

Optionally, the graphic representation of the identified errors and/or anomalies may comprise a graphic representation of the error data, e.g. text messages, diagrams, and/or images corresponding to the error data.

Figure 4:
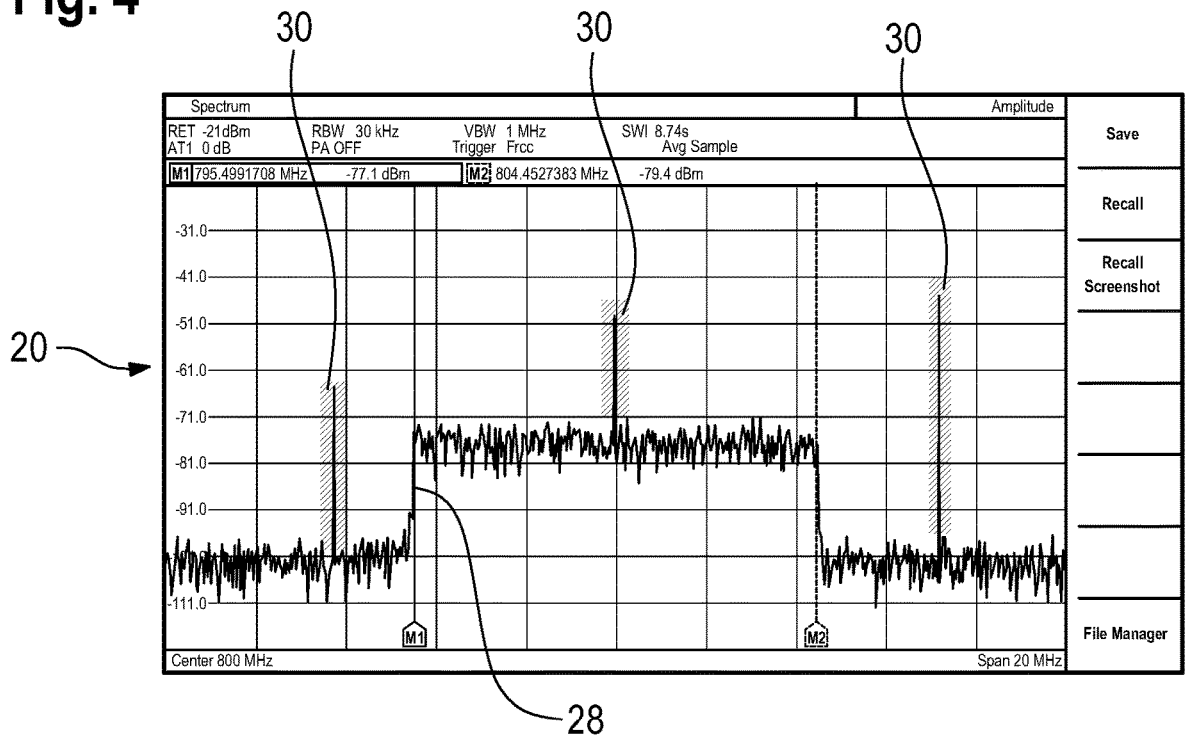
FIG. 4 shows a display of the measurement system of FIG. 1 or 2 displaying representative measurement data and identified errors or anomalies.
Figure 5:
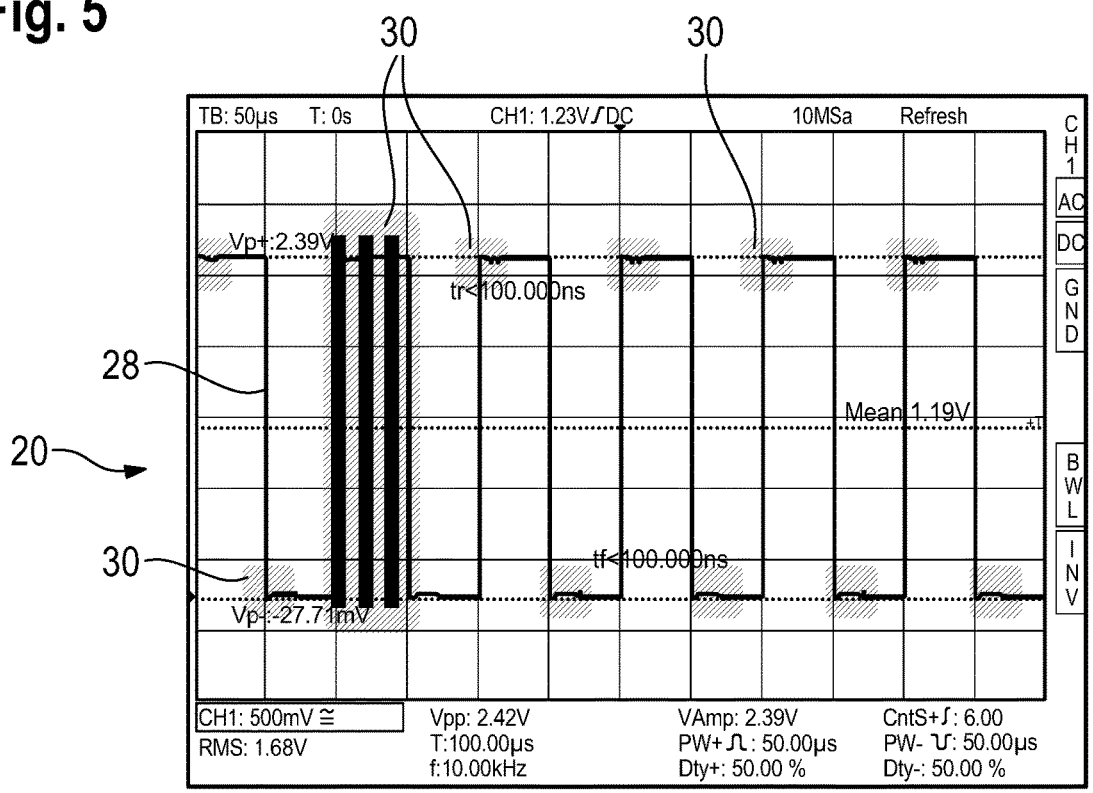
FIG. 5 shows a display of the measurement system of FIG. 1 or 2 displaying other representative measurement data and identified errors or anomalies.

The graphic representation of the measurement data and the graphic representation of the identified errors and/or anomalies are displayed on the display 20 simultaneously (step S5). The graphic representation of the measurement data and the graphic representation of the identified errors and/or anomalies are displayed in a superposed manner Examples of this are illustrated in FIGS. 4 and 5, which respectively show the graphic representation of the measurement data, namely a diagram 28, that is overlaid with a mask 30 corresponding to the graphic representation of the identified errors and/or anomalies.

Additionally, text messages and/or images may be displayed on the display 20 corresponding to the error data. The text messages and/or images may comprise information on a most likely source of the errors and/or anomalies, on a class of the errors and/or anomalies, on a specific type of the errors and/or anomalies, on possible ways to fix the errors and/or anomalies, and/or on a number of the identified errors and/or anomalies.

Steps S1 to S5 described above can be performed on-the-fly, i.e. during an active measurement of the at least one input signal received from the device under test 12. In other words, the measurement system 10 according the present disclosure is capable of identifying the errors and/or anomalies in real time.

Thus, the error analysis module 18 may run in the background during measurements performed by the T&A module 16. The error analysis module 18 may identify and display errors and/or anomalies on-the-fly, i.e. during the active measurements performed by the T&A module 16.

If an error and/or anomaly is identified, the error analysis module may generate a user warning (step S6). The user warning may comprise a visual signal, an acoustic signal and/or a haptic signal. For example, the user warning may comprise a flashing light that is displayed on the display 20 and/or a warning sound that is played by the loudspeaker 24.

Summarizing, the machine-learning module 22 is trained to automatically identify the presence of errors and anomalies within the measurement system 10, namely in the analysis data and/or in the configuration data. Accordingly, a user of the measurement system 10 does not need to have all the expert knowledge required in order to manually identify the errors and/or anomalies associated with the measurement data.

The machine-learning module 22 may be pre-trained by a manufacturer of the measurement system 10 or of components thereof. For example, an expert may perform several measurements as described above and mark the errors and anomalies in the graphic representation of the measurement data. In some embodiments, the expert may further identify a cause of the respective error or anomaly. This way, labelled training data is obtained that can be used for training the machine-learning module 22.

Alternatively or additionally, the machine-learning module 22 may be trained by a user of the measurement system 10. For example, an expert user may train the machine-learning module 22 as described above. After the training, the measurement system 10 can also be used by non-expert users, as the measurement system 10 is capable of identifying the errors and/or anomalies automatically after the training by the expert user.

Alternatively or additionally, settings for the machine-learning module 22 may be downloaded from a database, wherein the database may be saved on the computer module 26 or on another external server being connected to the error analysis module 18 via a network, for example via the internet.

The database may comprise respective settings for different types of measurements that can be loaded into the error analysis module 18. The database may be updated by the manufacturer or by users of the measurement system 10. For example, additional training data may be provided by the manufacturer and/or the users if new types of errors or anomalies are identified.

Certain embodiments disclosed herein, for example the respective module(s), utilize circuitry (e.g., one or more circuits) in order to implement standards, protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes one or more processors or portions thereof and accompanying software, firmware, hardware, and the like.

In some examples, the functionality described herein can be implemented by special purpose hardware-based computer systems or circuits, etc., or combinations of special purpose hardware and computer instructions.

Of course, in some embodiments, two or more of these components, or parts thereof, can be integrated or share hardware and/or software, circuitry, etc. In some embodiments, these components, or parts thereof, may be grouped in a single location or distributed over a wide area. In circumstances were the components are distributed, the components are accessible to each other via communication links.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The invention claimed is:

1. A measurement system, comprising:
    a test-and-measurement circuit configured to generate measurement data, the measurement data comprising at least one of analysis data and configuration data, wherein the analysis data is associated with an analysis of at least one input signal and the configuration data is associated with at least one of a physical measurement setup of the measurement system or measurement settings of the measurement system;
    the test-and-measurement circuit further being configured to generate a graphic representation of the measurement data; and
    an error analysis circuit configured to identify errors or anomalies associated with the measurement data based on the graphic representation and to generate a graphic representation of the identified errors or anomalies, the graphic representation of the identified errors or anomalies comprising a mask marking an area comprising the errors or anomalies,
    wherein the mask comprises information on thresholds associated with the errors or anomalies.

2. The measurement system of claim 1, wherein the error analysis circuit comprises a machine-learning circuit trained to identify the errors or the anomalies associated with the measurement data based on the graphic representation.

3. The measurement system of claim 2, wherein the machine-learning circuit comprises an artificial neural network trained to identify the errors or the anomalies associated with the measurement data based on the graphic representation.

4. The measurement system of claim 1, wherein the graphic representation comprises an image or a set of images.

5. The measurement system of claim 1, wherein the measurement system comprises a display configured to display both the graphic representation of the measurement data and the graphic representation of the identified errors or anomalies simultaneously.

6. The measurement system of claim 5, wherein the display is configured to display the graphic representation of the measurement data and the graphic representation of the identified errors or anomalies in a superposed manner.

7. The measurement system of claim 1, wherein the error analysis circuit is configured to generate error data, the error data comprising additional information on the identified errors or anomalies.

8. The measurement system of claim 1, wherein the error analysis circuit is configured to identify the errors or anomalies in real-time.

9. The measurement system of claim 1, wherein the error analysis circuit is configured to generate a user warning if an error or an anomaly is identified.

10. The measurement system of claim 1, wherein the test-and-measurement circuit and the error analysis circuit are both integrated into a common measurement device.

11. The measurement system of claim 1, further comprising a computer circuit, wherein the computer circuit is arranged external to the test-and-measurement circuit, and wherein the computer circuit comprises the error analysis circuit.

12. A measurement method, comprising:
    generating measurement data by a test-and-measurement circuit, the measurement data comprising at least one of analysis data and configuration data, the analysis data being associated with an analysis of at least one input signal, and the configuration data being associated with at least one of a physical measurement setup of a measurement system and measurement settings of the measurement system;

generating a graphic representation of the measurement data by the test-and-measurement circuit;

identifying errors or anomalies associated with the measurement data by an error analysis circuit based on the graphic representation; and generating a graphic representation of the identified errors or anomalies by the error analysis circuit;

wherein the graphic representation of the identified errors or anomalies comprises a mask marking an area comprising the errors or anomalies, and wherein the mask comprises information on thresholds associated with the errors or anomalies.

13. The measurement method of claim 12, wherein the error analysis circuit comprises a machine-learning circuit trained to identify the errors or the anomalies associated with the measurement data based on the graphic representation.

14. The measurement method of claim 13, wherein the machine-learning circuit comprises an artificial neural network trained to identify the errors or the anomalies associated with the measurement data based on the graphic representation.

15. The measurement method of claim 12, wherein both the graphic representation of the measurement data and the graphic representation of the identified errors or anomalies are displayed on a display simultaneously.

16. A measurement system, comprising:

a test and measurement circuit configured to generate measurement data, the measurement data comprising at least one of analysis data or configuration data, wherein the analysis data is associated with an analysis of at least one input signal and the configuration data is associated with at least one of a physical measurement setup of the measurement system or measurement settings of the measurement system;

the test-and-measurement circuit further being configured to generate a graphic representation of the measurement data; and an error analysis circuit configured to identify errors or anomalies associated with the measurement data based on the graphic representation and to generate a graphic representation of the identified errors or anomalies, the graphic representation of the identified errors or anomalies comprising a mask marking an area comprising the errors or anomalies, wherein the mask comprises at least one of a margin enclosing the area of the graphic representation of the measurement data comprising the errors or anomalies, a coloring marking the area comprising the errors or anomalies, and a shading marking the area comprising the errors or anomalies.

\* \* \* \* \*